(12) United States Patent
Ippolito et al.

(10) Patent No.: US 12,742,688 B2
(45) Date of Patent: Sep. 22, 2026

(54) DIGITAL TEMPERATURE SENSOR, CORRESPONDING DEVICE AND METHOD

(71) Applicant: STMicroelectronics International N.V., Geneva (CH)

(72) Inventors: Calogero Marco Ippolito, Aci Castello (IT); Giuseppe Bruno, Paterno (IT)

(73) Assignee: STMicroelectronics International N.V., Geneva (CH)

( * ) Notice: Subject to any disclaimer, the term of this patent is extended or adjusted under 35 U.S.C. 154(b) by 269 days.

(21) Appl. No.: 18/659,275

(22) Filed: May 9, 2024

(65) Prior Publication Data

US 2026/0016346 A1 Jan. 15, 2026

(30) Foreign Application Priority Data

May 31, 2023 (IT) ........................ 102023000011052

(51) Int. Cl.
*G01K 7/01* (2006.01)
*H03M 3/00* (2006.01)

(52) U.S. Cl.
CPC .............. *G01K 7/01* (2013.01); *H03M 3/436* (2013.01); *G01K 2219/00* (2013.01)

(58) Field of Classification Search
CPC ..... G01K 7/01; G01K 2219/00; H03M 3/436; H03M 3/458; H03M 3/43
See application file for complete search history.

(56) References Cited

U.S. PATENT DOCUMENTS

D678,822 S * 3/2013 Armigliato .................... D12/91
10,866,146 B2 12/2020 Ippolito et al.
11,095,261 B2 8/2021 Ippolito et al.
11,275,100 B2 3/2022 Vaiana et al.
11,368,165 B2 6/2022 Ippolito et al.
D958,207 S * 7/2022 Looije ..................... B29C 45/33 D15/135
D968,293 S * 11/2022 Bruno .......................... D12/195
D1,004,634 S * 11/2023 Armigliato .................... D15/30

(Continued)

OTHER PUBLICATIONS

Pertijs, Michiel A., et al., "Precision Temperature Sensors in CMOS Technology," Springer Science & Business Media; Dec. 6, 2006; XP093111649, 120 pages.

(Continued)

*Primary Examiner* — Lam T Mai
(74) *Attorney, Agent, or Firm* — Slater Matsil, LLP

(57) ABSTRACT

First and second transistors produce a first signal indicating the voltage drop difference across the transistors and a second signal indicating the voltage drop across the second transistor. The first and second signals increase and decrease, respectively, with temperature sensed based on the first signal via a gain factor. An ADC coupled to the transistors produces a pulsed output bitstream with a duty cycle based on the first and second signals via the gain factor. A selection stage intermediate the transistors and the ADC alternates first and second cycles under control of the bitstream, to transfer to the ADC during the first and second cycles, first and second numbers of alternations of signal transfer phases, wherein the first and second signals, respectively, are transferred with alternate signs to the ADC. The gain factor is based on the ratio of the first to the second number of alternations.

20 Claims, 6 Drawing Sheets

(56) References Cited

U.S. PATENT DOCUMENTS 11,817,838 B2 * 11/2023 Ippolito .............. H03F 3/45475
D1,022,800 S * 4/2024 Bruno ............................ D12/93
D1,031,542 S * 6/2024 Bruno .......................... D12/169
D1,039,570 S * 8/2024 Armigliato .................... D15/30
D1,040,870 S * 9/2024 Armigliato .................... D15/30
D1,069,665 S * 4/2025 Bruno ............................ D8/302
D1,075,854 S * 5/2025 Armigliato .................... D15/30
2002/0070432 A1 * 6/2002 Verde .................... H10W 42/00 257/784
2006/0125148 A1 * 6/2006 Keir .................... B29C 45/1603 264/334
2011/0148536 A1 * 6/2011 Italia .................... H03B 5/1296 331/117 FE
2012/0007663 A1 * 1/2012 Ricca ...................... G05F 1/465 327/538
2012/0219651 A1 * 8/2012 Weber ................. B29C 45/4005 425/149
2013/0006136 A1 * 1/2013 Biancolillo ............ A61B 5/053 600/547
2014/0218223 A1 * 8/2014 Darshan .................. H03M 3/39 341/143
2014/0291778 A1 * 10/2014 Vaiana ................. G01N 27/225 438/49
2014/0320218 A1 * 10/2014 Ippolito .................... H03L 7/00 331/34
2015/0035691 A1 * 2/2015 Chiricosta ........... H03M 1/0639 341/155
2015/0130113 A1 * 5/2015 Galt .................... B29C 45/4225 425/537
2015/0346025 A1 * 12/2015 Spinella ................ G01J 1/0219 250/252.1
2015/0352766 A1 * 12/2015 Hontheim ........... B29C 45/1742 425/150
2015/0377813 A1 * 12/2015 Biancolillo ............... B81B 7/02 257/467
2016/0003757 A1 * 1/2016 Biancolillo ............ G01N 27/18 73/335.05
2016/0290875 A1 * 10/2016 Vaiana ...................... G01K 7/01
2016/0327972 A1 * 11/2016 Ippolito ..................... G05F 3/30
2016/0347606 A1 * 12/2016 Bruno ...................... B81B 7/007
2017/0036382 A1 * 2/2017 Grove ................. B29C 45/2725
2018/0191341 A1 * 7/2018 Bartolomeo ......... H03K 17/691
2018/0212514 A1 * 7/2018 Ippolito .................. H02M 1/15
2018/0313699 A1 * 11/2018 Vaiana ...................... G01K 3/14
2019/0316973 A1 * 10/2019 Ippolito ................... G01K 7/01
2020/0050305 A1 * 2/2020 Ippolito ............. G01R 31/2829
2020/0256898 A1 * 8/2020 Vaiana ............... G01R 19/0038
2020/0259474 A1 * 8/2020 Ippolito .................. G05F 3/245
2021/0041391 A1 * 2/2021 Maira ................ G01N 27/3273
2021/0314000 A1 * 10/2021 Ippolito ................ H03M 3/348
2022/0170794 A1 * 6/2022 Castagna ................ G01J 5/045
2022/0170795 A1 * 6/2022 Bruno ........................ G01J 5/12
2022/0196485 A1 6/2022 Panja et al.
2022/0302890 A1 * 9/2022 Ippolito .............. H03F 3/45475
2023/0040666 A1 * 2/2023 Bruno ...................... F24F 8/108
2023/0152161 A1 * 5/2023 Bruno ..................... G01J 5/042 374/128
2023/0236161 A1 * 7/2023 Shankar ............. G01N 33/0027 73/31.06
2024/0036595 A1 * 2/2024 Ferlito .................... G05F 1/565
2024/0106451 A1 * 3/2024 Ippolito ................ H03M 1/124
2024/0146243 A1 * 5/2024 Sato ..................... H03K 3/0322
2024/0239648 A1 * 7/2024 Nicoli ..................... G01J 5/045
2026/0016346 A1 * 1/2026 Ippolito ................... G01K 7/01

OTHER PUBLICATIONS

Ministero delle Imprese e del Made in Italy, "Search Report and Written Opinion", Italian Application No. 202300011052, 11 pages, Dec. 19, 2023.

* cited by examiner

UD
bs
105
$f_s$
1043
1044
$V_{int}^+$
$V_{int}^-$
$\phi_1$
$\phi_2$
$C_{int}$
1040
CU
1042
1041
Cs
104
$V_{\Sigma\Delta}^+$
$V_{\Sigma\Delta}^-$
input_sel
106
$I_{PTAT}$
$pI_{PTAT}$
$\Delta V_{BE}$
$V_{BE}$
112
11
111
r

DIGITAL TEMPERATURE SENSOR, CORRESPONDING DEVICE AND METHOD

CROSS-REFERENCE TO RELATED APPLICATIONS

This application claims the priority benefit of Italian patent application number 102023000011052, filed on May 31, 2023, entitled "Digital temperature sensor, corresponding device and method" which is hereby incorporated herein by reference to the maximum extent allowable by law.

TECHNICAL FIELD

The description relates to digital temperature sensors.

One or more embodiments can be applied, for instance, in intelligent ("smart") sensors.

BACKGROUND

A smart sensor is a device that receives an input from an external environment and uses computing resources integrated therein to condition measured signals before transmission to a network control.

Smart sensors facilitate accurate and automated collection of data (environmental data, for instance).

These devices are used for monitoring and controlling mechanisms in many areas, including smart power distribution grids and a large number of scientific applications.

Smart sensors also play an important role in Internet of Things (IoT) applications and are an important part in sensor hubs.

Digital temperature sensors play an important role within a smart sensor and can be regarded as an essential element in facilitating satisfactory sensor operation.

A digital temperature sensor should desirably integrate in an integrated system a temperature sensing element, its bias circuit, and an analog-to-digital converter, ADC.

SUMMARY

An object of one or more embodiments is to contribute in facilitating the provision of such an integrated sensor.

According to one of more embodiments, that object is achieved with a sensor as set forth in the claims that follow.

One or more embodiments relate to a corresponding device. A device comprising a sensor circuit as disclosed herein and a user circuit coupled to the sensor circuit and configured to be operated as a function of a switching signal produced via a sensor circuit as disclosed herein may be exemplary of such a device.

One or more embodiments relate to a corresponding method.

The claims are an integral part of the technical teaching on the embodiments as provided herein.

One or more embodiments facilitate controlling a gain $\alpha$ (a proportionality coefficient) in a temperature sensor.

In solutions as proposed herein, the gain $\alpha$ is not affected by non-ideal factors, PVT variations and/or variations due to aging of functions. This facilitates providing high-precision temperature sensors. A high resolution in the signal detected via a temperature sensor is beneficial in those applications where detection with a high degree of accuracy is desirable.

Also, in solutions as proposed herein the proportionality coefficient $\alpha$ can be made adjustable ("trimmable").

Another advantage of solutions proposed herein is a reduction in area occupation, in so far as an array of capacitances can be replaced with a single capacitance.

BRIEF DESCRIPTION OF THE DRAWINGS

One or more embodiments will now be described, by way of example only, with reference to the annexed figures, wherein.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination or the extent of the feature.

Also, for the sake of simplicity and ease of explanation, a same designation may be applied throughout this description to designate:

- a certain node or line as well as a signal occurring at that node or line (a switch and a control signal for that switch, for instance); and/or
- a certain component (such as a capacitor or a resistor) as well as electrical parameter thereof (capacitance or resistance/impedance, for instance).

DETAILED DESCRIPTION OF ILLUSTRATIVE EMBODIMENTS

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment.

Furthermore, particular configurations, structures, or characteristics may be combined in any adequate way in one or more embodiments.

The headings/references used herein are provided merely for convenience and hence do not define the extent of protection or the scope of the embodiments.

As discussed previously, a smart sensor is a device that receives an input from an external environment and uses computing resources integrated therein to condition measured signals before transmission to a network control.

Smart sensors facilitate accurate and automated collection of data (environmental data, for instance).

Figures 1, 2:
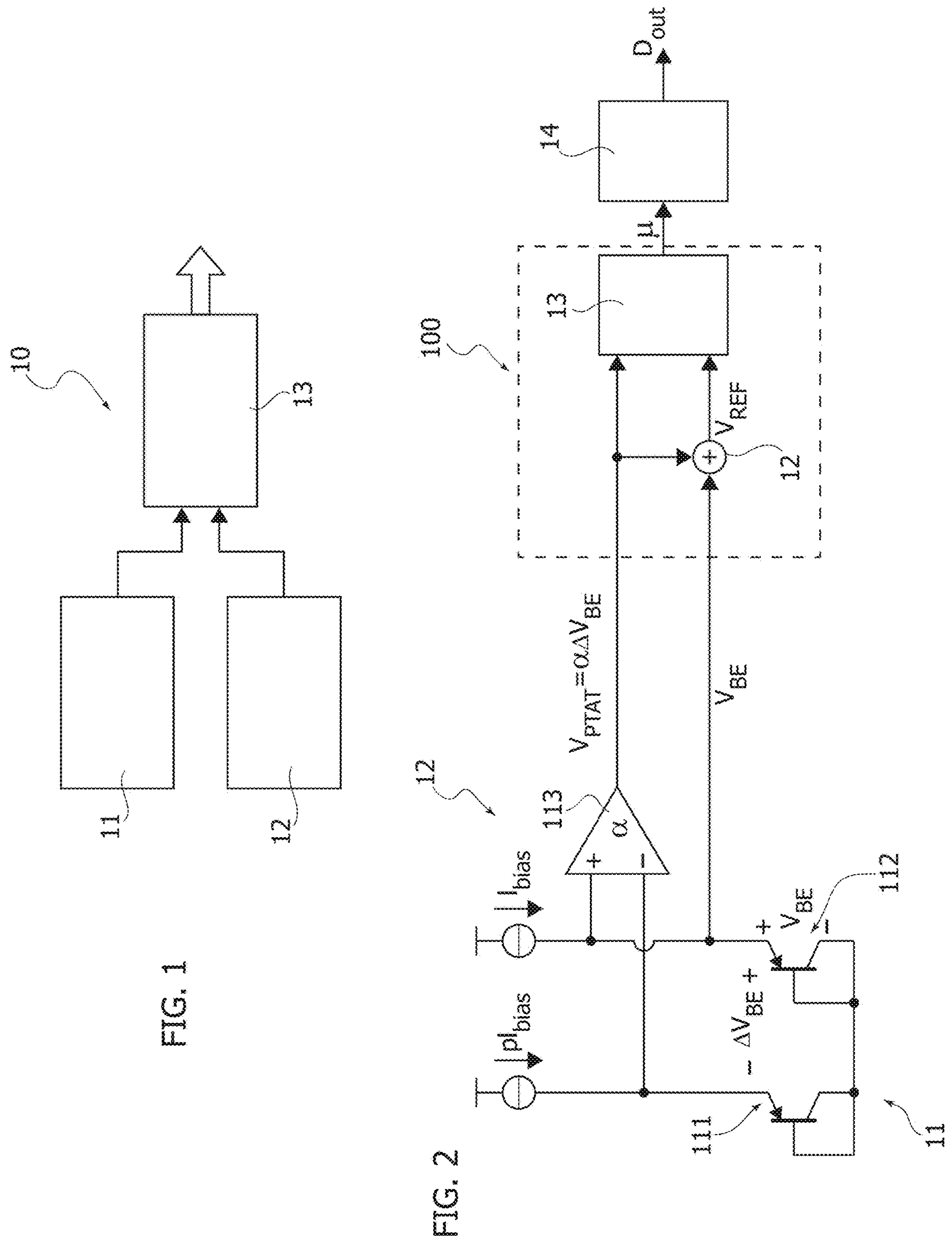
FIG. 1 is a block diagram of a digital temperature sensor.
FIG. 2 is a block diagram of a digital temperature sensor implemented in complementary metal-oxide semiconductor, CMOS technology.

FIG. 1 is a conceptual block diagram of a digital temperature sensor that includes (in a manner known per se to those of skill in the art):

- a temperature sensitive element 11 (sometimes referred to also as "probe") that provides an (analog) signal indicative of temperature;
- a reference source 12; and
- an analog-to-digital, ADC converter 13 supplied with the signal indicative of temperature from the sensitive element or sensor 11 and with a reference signal from the reference source 12.

FIG. 2 is a block diagram of a digital temperature sensor as this can be implemented, for instance and as a non-mandatory option, in complementary metal-oxide semiconductor, CMOS technology.

In the digital temperature sensor of FIG. 2, the temperature sensitive element 11 is implemented via two diode-connected bipolar transistors (PNP, for instance) 111 and 112. The transistors 111 and 112 have bias current $pI_{bias}$ and $I_{bias}$, respectively, and are arranged with their collectors and bases commonly connected to ground to generate at their emitters two voltages $V_{BE}$ and $V_{BE}+\Delta V_{BE}$.

These voltages are combined via a differential stage 113 via a proportionality factor or gain α (alpha) and a summing node 12 to produce:

$$\text{a first voltage } V_{PTAT} = \alpha \cdot \Delta V_{BE}, \text{ and}$$

$$\text{a second (reference) voltage } V_{REF} = V_{BE} + \alpha \cdot \Delta V_{BE}$$

These voltages are in turn converted to digital via an analog-to-digital converter, ADC 13 and scaling logic 14.

The ADC converter 13 produces a digital signal obtained as the ratio $V_{PTAT}/V_{REF}$, namely $$\alpha \cdot \Delta V_{BE}/[V_{BE} + \alpha \cdot \Delta V_{BE}].$$

This turns out to be a digital bitstream of pulses having a duty-cycle μ and directly proportional to the temperature to be measured. The scaling logic 14 can be configured to correct the slope and the offset of that signal via coefficients A and B so as to generate an output signal $D_{out}$ which can be regarded as an accurate measure of temperature as desired to be measured:

$$D_{OUT} = A \cdot \alpha \cdot \Delta V_{BE}/V_{REF} - B$$

That is, the output signal from the converter 13 is a binary signal, an alternation of 0s and 1s, and the duty cycle μ is essentially an average of that signal.

As otherwise known to those of skill in the art, the voltages $V_{BE}$ and $\Delta V_{BE}$ have, respectively:

- a CTAT (Complementary To Absolute Temperature) behavior, that is, the voltage $V_{BE}$ decreases as the temperature increases; and
- a PTAT (Proportional To Absolute Temperature) behavior, that is, the difference $\Delta V_{BE}$ increases as the temperature increases.

An adequate combination of these voltages facilitates obtaining a voltage $V_{REF}$ which does not vary as the temperature increases, that is a voltage $V_{REF}$ independent of temperature.

The voltage $\Delta V_{BE}$ can be regarded as highly linear and precise in temperature. Accuracy in the output signal Dout of the temperature sensor as a function of ambient temperature variations is thus mainly dictated by the accuracy of the gain factor α of the differential stage 113.

Accordingly, designing a high-precision digital temperature sensor is facilitated by techniques that increase (maximize) the accuracy in implementing the gain factor α.

Figure 3:
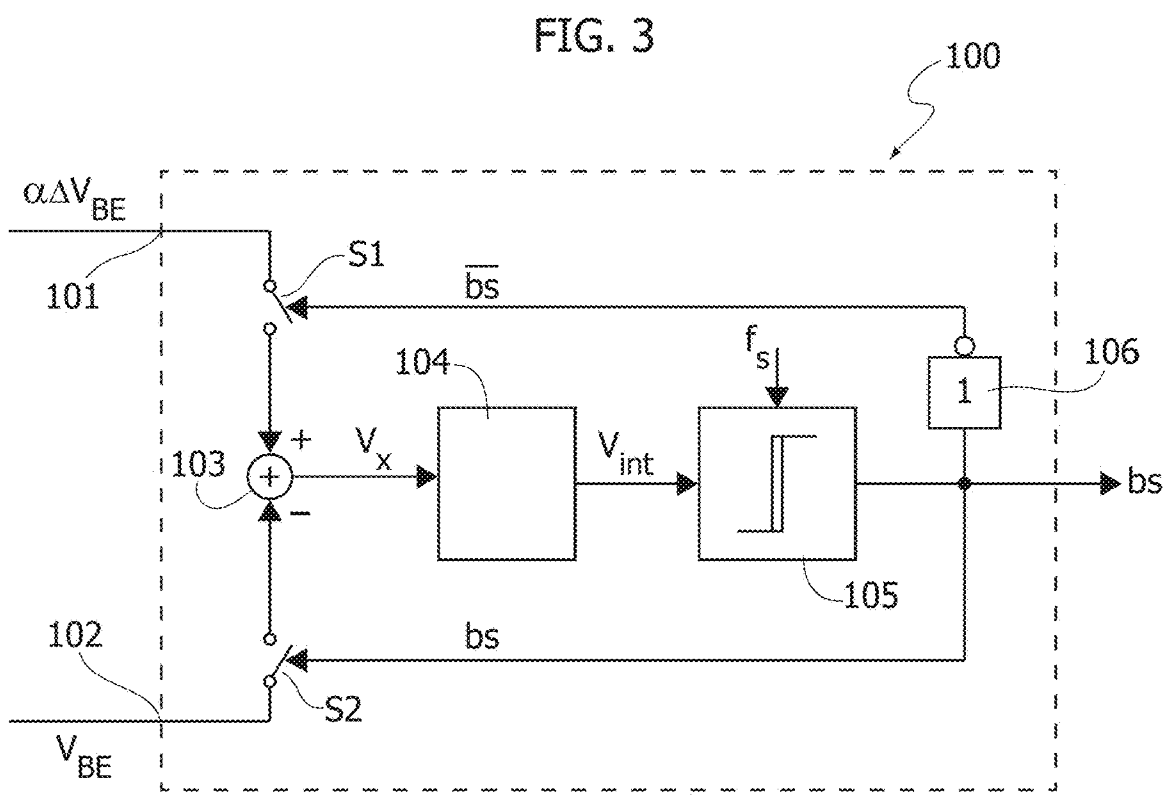
FIG. 3 is a block diagram of an exemplary implementation of a portion of a digital temperature sensor.

FIG. 3 is a block diagram of a possible exemplary implementation of a portion of digital temperature sensor as illustrated in FIG. 2, with the block 100 in FIG. 3 having the same output of the block 100 in FIG. 2, even though FIG. 3 does not include sub-blocks directly corresponding to the sub-blocks 12 and 13 in FIG. 2.

Such implementation, based on a sigma-delta (Σ/Δ) modulator 100, is known per se to those of skill in the art: see, for instance, M. A. P. Pertijs, et al. "Precision Temperature Sensor in CMOS technology," Springer Science & Business Media, 6 Dec. 2006, pp. 227-269 or U.S. Pat. No. 10,866,146 B2 (Ippolito and Vaiana, Inventors).

Figure 4:
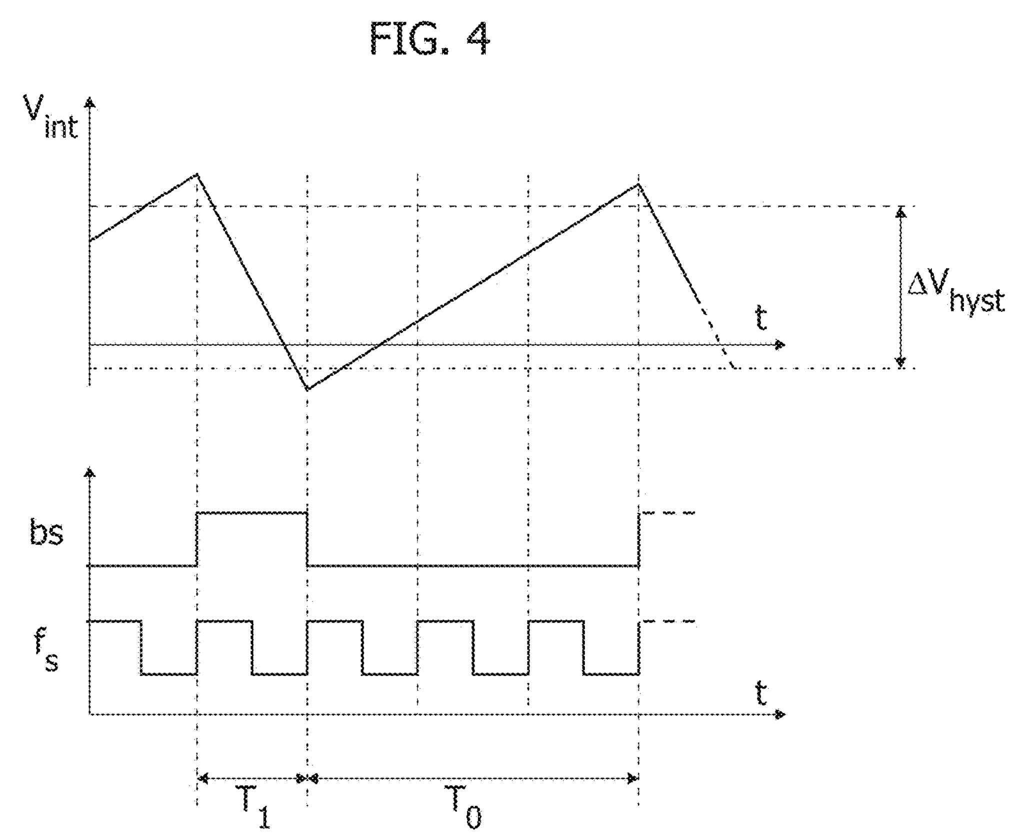
FIG. 4 shows possible waveforms of signals that may occur in a circuit as illustrated in FIG. 3.

FIG. 4 shows possible waveforms (time behavior) of signals that may occur in a circuit as illustrated in FIG. 3.

The sigma-delta (Σ/Δ) modulator 100 has two inputs 101, 102 configured to be supplied with the signals $\alpha \cdot \Delta V_{BE}$ and $V_{BE}$, respectively. These signals are applied via switches S1 and S2 to a summation node (with sign) 103 so that a signal Vx that is a function of the difference between $\alpha \cdot \Delta V_{BE}$ and $V_{BE}$ is applied to a loop filter 104 that can be implemented with an integrator.

An (integrated) signal Vint from the loop filter 104 is applied to a comparator 105 (with hysteresis) that is configured to switch its output signal bs at the edges, for example the rising edges, of a clock signal fs (with period 1/Ts, generated in a manner known per se to those of skill in the art).

The output signal bs is a binary signal (a sequence of 0s and 1s) that is synchronized with the frequency fs and can be used to control:

- the switch S1, via a logically negated replica neg(bs) of the signal bs; this is obtained via an inverter 106, so that the switch S1 is conductive in response to neg(bs) being "high", that is, bs being "low"; and
- the switch S2, so that the switch S2 is conductive in response to bs being "high".

The switches S1 and S2 are thus turned "on" (conductive) and "off" (non-conductive) in an alternated manner. The input signal Vx to the loop filter 104 is determined as follows:

- if the output Vint from the loop filter 104 exceeds a first (high) threshold of the comparator 105, then the output bs is set to 1 and therefore the signal Vx is set equal to $-V_{BE}$, and if the output Vint from the loop filter 104 is lower than a second (lower) threshold of the comparator 105, then the output bs is set to 0 and therefore the signal Vx is set equal to $\alpha \cdot \Delta V_{BE}$.

Due to the comparator hysteresis $\Delta V_{hyst}$, the output of the loop filter 104 oscillates approximately between the thresholds of the comparator 105.

If the frequency fs is high enough, then the loop filter output Vint oscillates quite precisely between the thresholds of the comparator 105.

Consequently, as visible in FIG. 4, an increase in the loop filter output signal Vint during a time $T_0$ (during which the comparator output is low) is equal to its decrease during a time $T_1$ (during which the comparator output is high).

In other words, in the circuit of FIG. 3 the feedback loops based on the signal bs facilitate striking a balance between the charge accumulated during the phase $T_1$ (the sampling periods where bs=1) and the charge accumulated during the phase $T_0$ (the sampling periods where bs=0).

The circuit of FIG. 3 thus facilitates obtaining a signal bs having a duty cycle with a value μ that can be expressed as:

$$\mu = \alpha \cdot \Delta V_{BE} / [V_{BE} + \alpha \cdot \Delta V_{BE}]$$

In fact:

$$G_{LF\_bs0} \cdot \Delta V_{BE} \cdot T_0 + G_{LF\_bs1} \cdot (-\Delta V_{BE}) \cdot T_1 = 0$$

and considering that $G_{LF\_bs0} = G_{LF\_bs1} = G_{LF}$ where $G_{LF\_bs0}$ and $G_{LF\_bs1}$ are indicative of the filtering applied to the input signal $\Delta V_{BE}$ during a period $T_0$ while bs=0 and to the input signal $-V_{BE}$ during a period $T_1$ while bs=1, respectively, then $$\left[(T_0 + T_1 - T_1)/(T_0 + T_1)\right] \cdot \Delta V_{BE} + \left[T_1/(T_0 + T_1)\right] \cdot (-V_{BE}) = 0$$

and thus $$(1 - \mu) \cdot \alpha \cdot \Delta V_{BE} + \mu \cdot (-V_{BE}) = 0$$

The circuit of FIG. 3 thus facilitates obtaining a signal useful for a temperature sensor, as the relationships highlighted above demonstrate.

Figure 5:
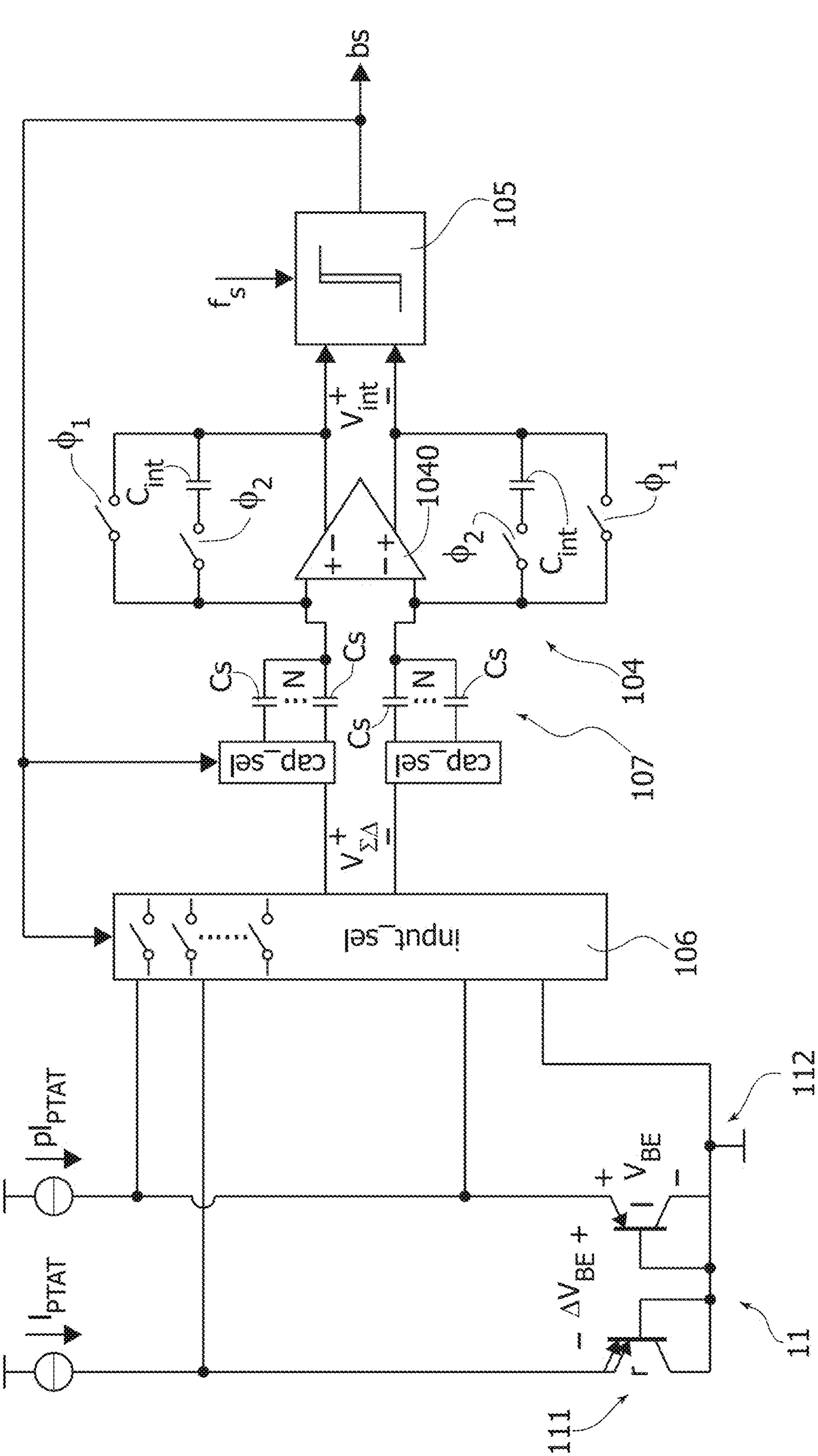
FIG. 5 is a block diagram of an exemplary digital temperature sensor implemented via a switched-capacitor technique.

A possible implementation of a temperature sensor based on the circuit of FIG. 3 via a switched-capacitors technique is represented in FIG. 5. The disclosure in U.S. Pat. No. 10,866,146 B2 (already cited) can also be referred to in that respect.

Figure 6:
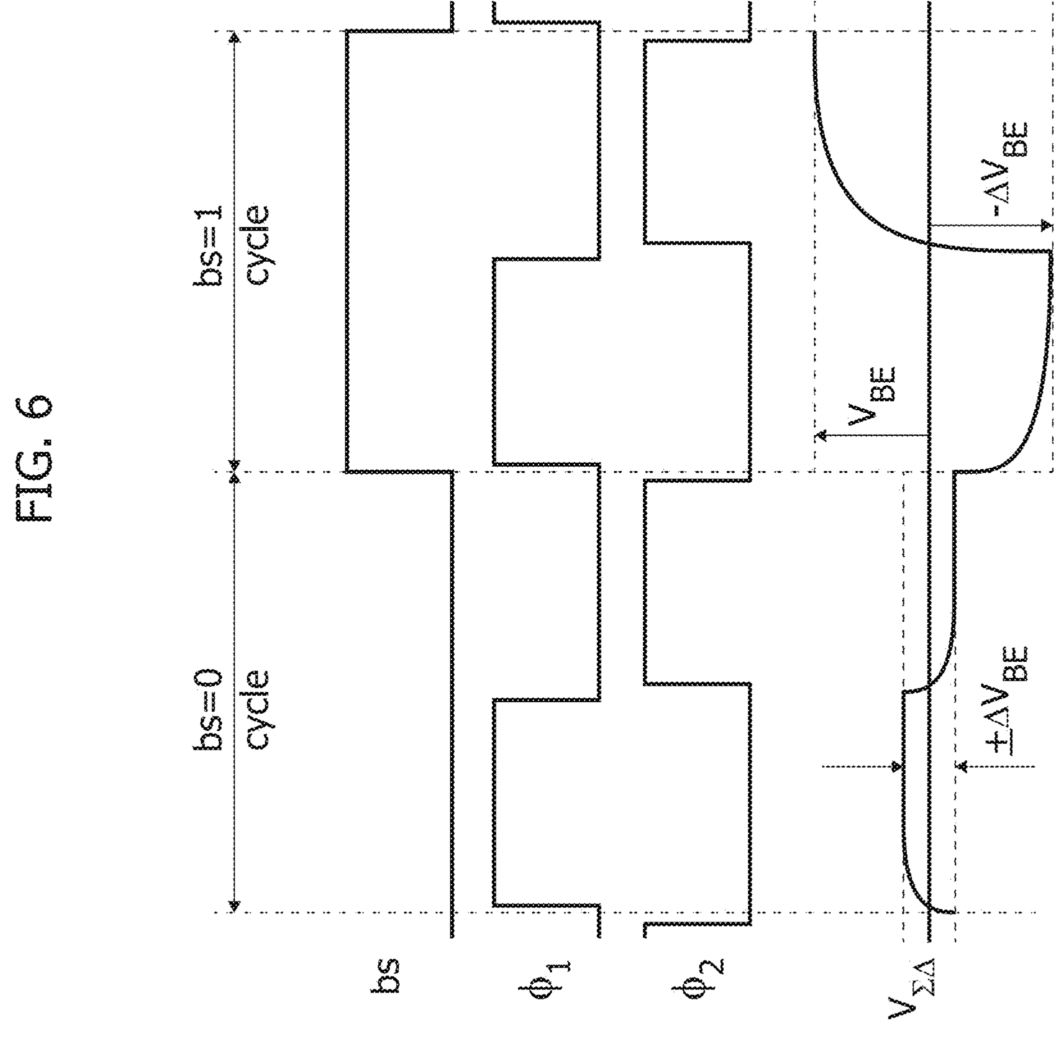
FIG. 6 shows possible waveforms of signals that may occur in a sensor as illustrated in FIG. 5.

FIG. 6 shows (also in connection with FIG. 4) possible waveforms of signals that may occur in a sensor as illustrated in FIG. 5.

For ease of understanding, parts and elements like parts or elements already introduced in discussing FIGS. 1 to 4 are indicated with like references in FIGS. 5 and 6 so that a detailed description will not be repeated for brevity for FIGS. 5 and 6.

In FIG. 5, the loop filter 104 is provided as a switched-capacitor differential integrator implementing an auto-zero technique.

As illustrated in FIG. 5, the switched-capacitor differential integrator 104 includes a fully differential amplifier (op-amp) 1040 providing across its outputs a differential output voltage Vint to the comparator 105 with two feedback branches from the outputs to the inputs of the differential amplifier (op-amp) 1040.

These feedback branches include:

a first branch with a first switch Φ1 that, when conductive, provides a direct output-to-input connection path for the amplifier 1040; and a second branch arranged in parallel to the first branch with a second switch Φ2 connected in series to an (integration) capacitor $C_{int}$ so that, when conductive, the switch Φ2 provides an indirect output-to-input connection path for the amplifier 1040 via the integration capacitor $C_{int}$.

In FIG. 5 the temperature sensing element or probe 11 again includes via two diode-connected bipolar transistors (BJT) 111 and 112, having bias currents $I_{PTAT}$ and $pI_{PTAT}$, where the designation PTAT (Proportional To Absolute Temperature) indicates that these currents increase as the temperature increases.

The two BJT transistors 111, 112 have an area ratio of r:1, are driven by bias currents $I_{PTAT}$ and $pI_{PTAT}$ that have a ratio 1:p and are used to generate the voltages $\Delta V_{BE}$ and $V_{BE}$.

The references 106 and 107 designate blocks arranged between the temperature sensing circuitry 11 (transistors 111 and 112) and the switched-capacitor differential integrator 104.

The blocks 106 and 107 are configured to facilitate input selection ("input_sel") and capacitor selection ("cap_sel"), respectively.

This occurs under the control of the signal bs and two signals Φ1, Φ2 that control the homologous switches discussed in the foregoing: as noted, for simplicity and ease of understanding, a same designation is used here to denote these switches and the control signals applied thereto.

The signals bs, Φ1 and Φ2 determine a signal $V_{\Sigma\Delta}$ applied to the input of the integrator 104.

In an arrangement as illustrated in FIGS. 5 and 6, the signals Φ1, Φ2 are generated (in a manner known per se to those of skill in the art) to have the same frequency of the clock signal fs and are mutually out-of-phase (approximately 180°) as exemplified in FIG. 6.

Specifically (as shown herein by way of example):

if bs=0, Φ1=1, and Φ2=0, the signal $V_{\Sigma\Delta}$ is set to $+\Delta V_{BE}$ by the "input_sel" block 106, while when Φ1 and Φ2 switch (that is bs=0, Φ1=0, and Φ2=1) the signal $V_{\Sigma\Delta}$ is set to the value $-\Delta V_{BE}$. During each interval with bs=0 (denoted bs=0 cycle in FIG. 6 and whose duration is one clock period, Ts=1/fs) the "cap_sel" selection blocks 107 connect in parallel a number of capacitors equal to N1 (where N1 is an integer). During such a phase where the switches Φ1 are conductive, the opamp 1040 is configured for a unitary gain and $+\Delta V_{BE}$ is sampled over two (differential) banks of N1 sampling capacitors Cs. During a phase where the switches Φ2 are conductive, the integration capacitors Cint are switched into the feedback paths of the amplifier 1040, while the inputs switch to a differential signal $-\Delta V_{BE}$. Consequently, a charge equal to $N1 \cdot Cs \cdot 2 \cdot \Delta V_{BE}$ is transferred from each of the two capacitor banks to each integrating capacitor Cint. If Cs denotes the size (capacitance) of one of the sampling capacitors Cs1, . . . , CsN in the bank, the differential (delta) voltage in the voltage Vint during that sampling period with bs=0 will be equal to $\Delta V_{int\_bs0} = [(2 \cdot N1 \cdot Cs \cdot 2)/Cint] \cdot \Delta V_{BE}$;

if bs=1, Φ1=1, and Φ2=0, the signal $V_{\Sigma\Delta}$ is set to $-V_{BE}$ by the "input_sel" block 106, while when Φ1 and Φ2 switch (that is, bs=1, Φ1=0, and Φ2=1) the signal $V_{\Sigma\Delta}$ is set to the value $+V_{BE}$. During each interval with bs=1 (denoted bs=1 cycle in FIG. 6 and whose duration is one clock period, Ts=1/fs) the "cap_sel" selection blocks 107 connect in parallel a number of capacities equal to N2 (where N2 is an integer). During the phase where the switches Φ1 are conductive, the opamp 1040 is configured with unitary gain and $-V_{BE}$ is sampled over two differential banks of N2 sampling capacitors Cs. During the phase where the switches Φ2 are conductive, the integration capacitors Cint are switched into the feedback paths of the amplifier 1040, while the inputs switch to a differential signal $+V_{BE}$. As a result, a charge equal to $-N2 \cdot Cs \cdot 2 \cdot V_{BE}$ is transferred from each of the two capacitor banks to each integrating capacitor Cint. If Cs denotes the size (capacitance) of one of the sampling capacitors Cs1, . . . , CsN in the bank, the differential (delta) voltage in the voltage Vint during that sampling period with bs=1 will be equal to $\Delta V_{int\_bs1}=[(2 \cdot N2 \cdot Cs \cdot 2)/Cint] \cdot (-V_{BE})$.

As in the case of FIG. 3, the feedback action facilitates an overall balance of the charge accumulated during the phase T1 (the periods where bs=1) and the charge accumulated during the phase T0 (that is, the periods where bs=0).

Here again:

$$G_{LF\_bs0} \cdot \Delta V_{BE} \cdot T_0 + G_{LF\_bs1} \cdot (-\Delta V_{BE}) \cdot T_1 = 0$$

and thus, one has $$[(2 \cdot N1 \cdot Cs \cdot 2)/Cint] \cdot (1/Ts) \cdot \Delta V_{BE} \cdot T_0 + [(2 \cdot N2 \cdot Cs \cdot 2)/Cint] \cdot (1/Ts) \cdot (-V_{BE}) \cdot T_1 = 0.$$

This is based on the previous explanation of operation in the case "if bs=0, Φ1=1, and Φ2=0" and in the case "if bs=1, Φ1=1, and Φ2=0", which facilitates identifying [(2·N1·Cs·2)/Cint]·(1/Ts) equal to $G_{LF\_bs0}$ e [(2·N2·Cs·2)/Cint]·(1/Ts) equal to $G_{LF\_bs1}$. Here again $G_{LF\_bs0}$ and $G_{LF\_bs1}$ can be regarded as indicative of the filtering applied to the input signal $\Delta V_{BE}$ during a period $T_0$ while bs=0 and to the input signal $-V_{BE}$ during a period $T_1$ while bs=1, respectively, and thus $$(1-\mu) \cdot N1 \cdot Cs \cdot \Delta V_{BE} + \mu \cdot (-N2 \cdot Cs \cdot V_{BE}) = 0$$

so that $$\mu = (N1 \cdot Cs/N2 \cdot Cs) \cdot \Delta V_{BE} / [V_{BE} + (N1 \cdot Cs/N2 \cdot Cs) \cdot \Delta V_{BE}]$$

and (again)

$$\mu = \alpha \cdot \Delta V_{BE} / [V_{BE} + \alpha \cdot \Delta V_{BE}]$$

The circuit of FIG. 5 thus facilitates obtaining a value of the duty cycle μ of the output signal bs that can be exploited for temperature sensing as already discussed in connection with FIG. 2.

Figure 7:
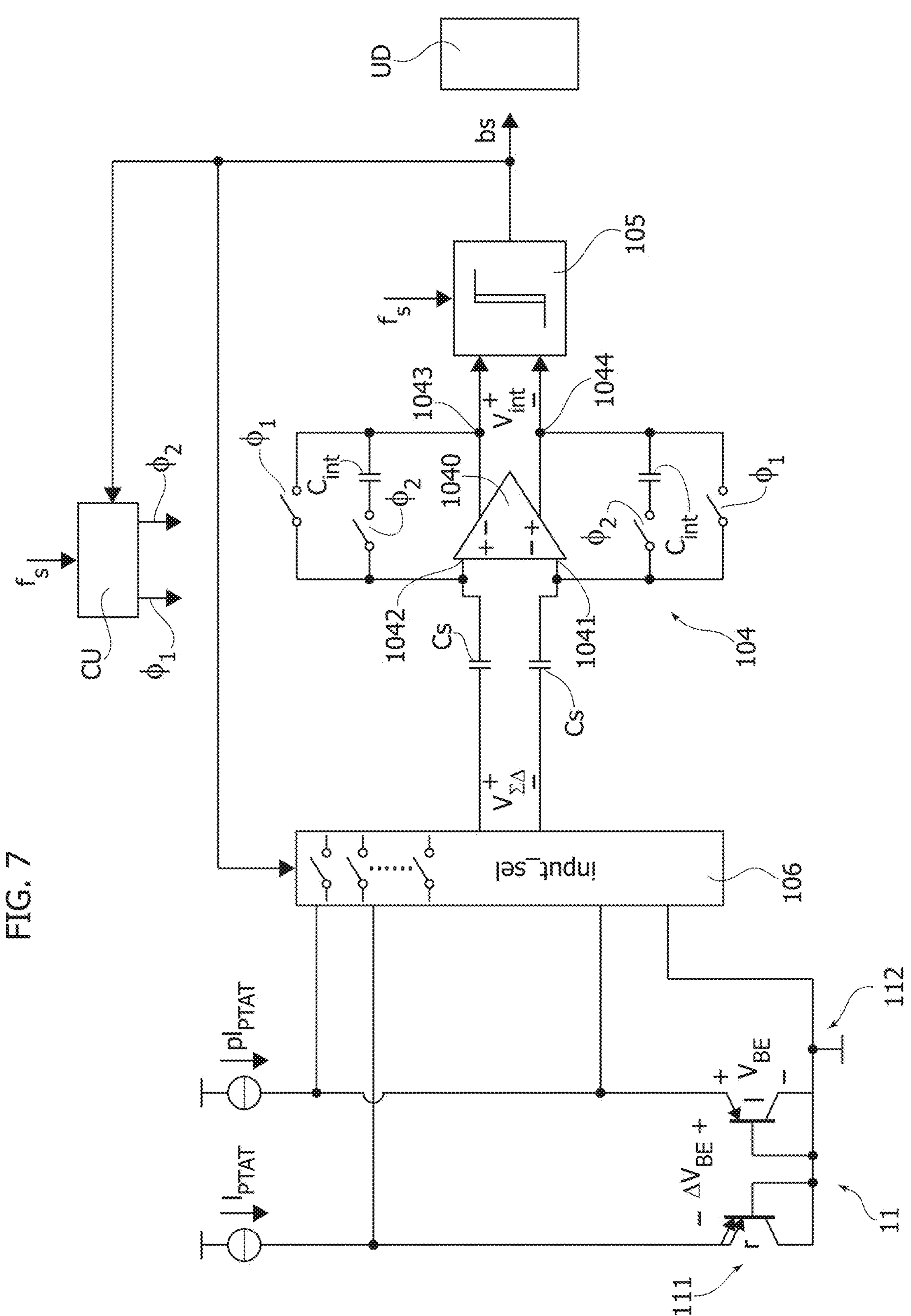
FIG. 7 is a block diagram of an exemplary implementation of a digital temperature sensor according to embodiments of the present description.

FIG. 7 is a block diagram of an exemplary implementation of a digital temperature sensor according to embodiments of the present description.

Figure 8:
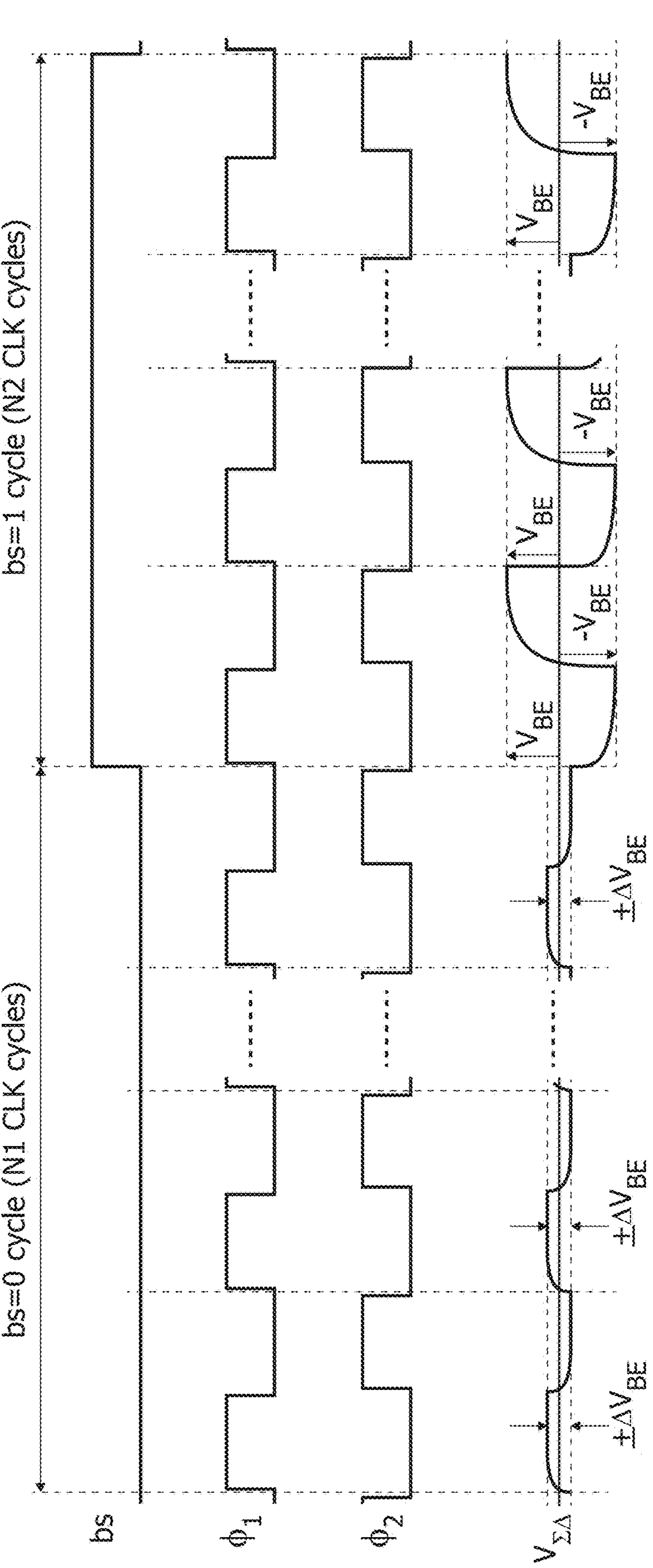
FIG. 8 shows possible waveforms of signals that may occur in a sensor as illustrated in FIG. 7.

FIG. 8 shows possible waveforms (time behavior) of signals that may occur in a sensor as illustrated in FIG. 7.

Once again, for ease of understanding, parts and elements like parts or elements already introduced in discussing FIGS. 1 to 6 are indicated with like references in FIGS. 7 and 8, so that a detailed description will not be repeated for brevity for FIGS. 7 and 8.

In FIG. 7 the loop filter 104 is again a switched-capacitor differential integrator where an autozero feature is also implemented.

As illustrated in FIG. 7, the switched-capacitor differential integrator 104 again includes a fully differential amplifier (op-amp) 1040 having input nodes 1041, 1042 providing across its output nodes 1043, 1044 a differential output voltage Vint to the comparator 105 with two feedback branches from the outputs to the inputs of the differential amplifier (op-amp) 1040.

These feedback branches include:

- a first branch with a first switch Φ1 that, when conductive, provides a direct output-to-input connection path (for instance, from an inverting output 1043 to a non-inverting input 1041 and from a non-inverting output 1044 to an inverting input 1042) for the amplifier 1040; and
- a second branch arranged in parallel to the first branch (that is, with the same output-to-input layout just discussed) with a second switch Φ2 connected in series to an (integration) capacitor Cint so that, when conductive, the switch Φ2 provides an indirect output-to-input connection path for the amplifier 1040 via the integration capacitor Cint.

In FIG. 7 the temperature sensing circuitry or probe 11 again includes two diode-connected bipolar transistors (BJT) 111 and 112, having bias currents $I_{PTAT}$ and $pI_{PTAT}$, where the designation PTAT (Proportional To Absolute Temperature) indicates that these currents increase as the temperature increases.

The two BJT transistors 111, 112 have an area ratio r:1, are driven by bias currents IPTAT and pIPTAT that have a ratio 1:p and are used to generate the voltages $\Delta V_{BE}$ and $V_{BE}$.

In FIG. 7, an "input_sel" block 106 is arranged between the temperature sensing element 11 (transistors 111 and 112) and the switched-capacitor differential integrator 104.

The block 106 is configured to facilitate input selection ("input_sel") under the control of the signal bs and the signals Φ1, Φ2 that control the homologous switches discussed in the foregoing: as noted, for simplicity and ease of understanding a same designation is used here to denote these switches and the control signals applied thereto. The signals bs, Φ1 and Φ2 determine a signal $V_{\Sigma\Delta}$ applied to the input of the integrator 104.

Once more, in FIG. 7, the input signal to the loop filter 104 is determined as follows:

- if the output Vint from the loop filter 104 exceeds a first (high) threshold of the comparator 105, then the output bs is set to 1, and
- if the output Vint from the loop filter 104 is lower than a second (lower) threshold of the comparator 105, then the output bs is set to 0.

Due to the comparator hysteresis $\Delta V_{hyst}$, the output of the loop filter 104 oscillates approximately between the thresholds of the comparator 105.

If the frequency fs is high enough, then the loop filter output Vint oscillates quite precisely between the thresholds of the comparator 105.

Consequently (as already discussed in connection with FIG. 4), an increase in the loop filter output signal Vint during a time $T_0$ (during which the comparator output is low) is equal to its decrease during a time $T_1$ (during which the comparator output is high).

Once again, in the circuit of FIG. 7 the feedback loops based on the signal bs facilitate striking a balance between the charge accumulated during the phase $T_1$ (the sampling periods where bs=1) and the charge accumulated during the phase $T_0$ (the sampling periods where bs=0).

To summarize, FIG. 7 is again illustrative of a circuit comprising temperature sensing circuitry including first 111 and second 112 diode-connected transistors configured to produce (in a manner per se conventional in the art):

- a first signal $\Delta V_{BE}$ indicative of the difference of the voltage drops (base-emitter in the exemplary case of bipolar transistors) across the first 111 and second 112 diode-connected transistors, and
- a second signal $V_{BE}$ indicative of the voltage drop (base-emitter in the exemplary case of a bipolar transistor) across the second diode-connected transistor.

The first signal $\Delta V_{BE}$ and the second signal $V_{BE}$ increase and decrease, respectively, with temperature, and temperature sensed via the temperature sensing circuitry 111, 112 is a function of the first signal $\Delta V_{BE}$ via a gain factor $\alpha$ (see, for instance the signal Dout in FIG. 2, where $D_{OUT}=A\cdot\alpha\cdot\Delta V_{BE}/V_{REF}-B$, as discussed).

In FIG. 7, a sigma-delta analog-to-digital converter 104, 105 is illustrated coupled to the temperature sensing circuitry (the transistors 111, 112); the converter 104, 105 has (at the output of the comparator 105) an output node configured to produce a pulsed output bitstream bs having a duty cycle $\mu$ (essentially an average) that is a function of the first signal $\Delta V_{BE}$ and the second signal $V_{BE}$ via the gain factor $\alpha$.

Here again this result is facilitated by the sigma-delta analog-to-digital converter built around the integrator (loop filter) 104 comprising a hysteresis comparator 105 coupled to the gain stage 1040 in the integrator and configured to produce the pulsed output bitstream bs having a duty cycle $\mu$:

- with a first logic value (1, for instance) in response to the output from the gain stage 1040 being higher than an upper threshold of the comparator 105, and
- with a second logic value (0, for instance) in response to the output from the gain stage 1040 being lower than a lower threshold of the comparator 105.

In FIG. 7, a selection stage 106 is again illustrated arranged intermediate the temperature sensing circuitry (the transistors 111, 112) and the converter 104, 105.

In contrast with the solution illustrated in FIGS. 5 and 6, in the solution proposed in FIGS. 7 and 8 the "cap_sel" blocks 107 of FIG. 5 are dispensed with and the two banks of sampling capacitances s1, . . . CsN of FIG. 5 are replaced by a single "unitary" capacitance of value Cs.

This represents an advantage of the solution proposed in FIGS. 7 and 8 over the prior art, namely an advantage in terms of area occupation, which is facilitated by a driving approach as illustrated in FIG. 8 and discussed in the following.

The signals Φ1 and Φ2 are synchronized with the frequency of the clock signal fs and are mutually out-of-phase (approximately 180°) as illustrated in FIG. 8.

Specifically, in the solution illustrated in FIGS. 7 and 8:

- if bs=0, Φ1=1, and Φ2=0, the signal $V_{\Sigma\Delta}$ signal is set to $+\Delta V_{BE}$ by the "input_sel" block 106, while when Φ1 and Φ2 switch (that is, bs=0, Φ1=0 and Φ2=1) the signal $V_{\Sigma\Delta}$ is set to the value $-\Delta V_{BE}$. During each interval with bs=0 (denoted bs=0 cycle in FIG. 8 and having a duration of one clock period, Ts=1/fs) unlike the solution according to FIG. 5, where only one period of the signals Φ1 and Φ2 is present during one clock period, Ts=1/fs) the function of the "cap_sel" blocks 107 of FIG. 5 is so-to-say replaced by driving N1 periods or clock cycles of the signals Φ1 and Φ2 (where N1 is an integer). During the phase Φ1, the opamp 1040 is configured with unity gain (in response to the switches Φ1 being conductive with the switches Φ2 non-conductive) and $+\Delta V_{BE}$ is sampled over the two "unitary" sampling capacitances Cs in a differential configuration. During the phase Φ2, the integration capacitors Cint are switched into the feedback paths of the opamp 1040 (in response to the switches Φ2 being conductive with the switches Φ1 non-conductive), while the inputs switch to a differential signal $-\Delta V_{BE}$. Consequently, in (each) one period of the signals Φ1 and Φ2, a charge equal to $Cs\cdot 2\cdot\Delta V_{BE}$ is transferred from each capacitance Cs to a respective integration capacitance Cint. Since in each interval with bs=0 the capacitance Cs is switched N1 times to inject charge into Cint, the resulting charge transferred to each integration capacitor Cint during each interval will be equal to $N1\cdot Cs\cdot 2\cdot\Delta V_{BE}$. The differential (delta) voltage in the voltage Vint during that sampling period with bs=0 will be equal to $\Delta V_{int\_bs0}=[(2\cdot N1\cdot Cs\cdot 2)/Cint]\cdot\Delta V_{BE}$. It is noted that switching N1 times the signals Φ1 and Φ2 does not represent a disadvantage in comparison with the prior art, in so far as the switched capacitance in the solution of FIGS. 7 and 8 is N1 times smaller, so that switching can occur N1 times faster. Therefore, each interval with bs=0 in the solution of FIGS. 7 and 8 can have the same clock period of duration Ts as in the prior art;
- if bs=1, Φ1=1, and Φ2=0, the signal $V_{\Sigma\Delta}$ signal is set to $-V_{BE}$ by the "input_sel" block 106, while when Φ1 and Φ2 switch (i.e., bs=1, Φ1=0 and Φ2=1) the signal $V_{\Sigma\Delta}$ is set to the value $+V_{BE}$. During each interval with bs=1 (whose duration is one clock period, Ts=1/fs), unlike the solution according to FIG. 5, where only one period of the signals Φ1 and Φ2 is present, the function of the "cap_sel" blocks 107 of FIG. 5 is "replaced" by N2 periods of the signals Φ1 and Φ2 (where N2 is an integer). During the phase Φ1, the opamp 1040 is configured with unity gain (in response to the switches Φ1 being conductive with the switches Φ2 non-conductive) and $-V_{BE}$ is sampled over the two unity sampling capacities Cs in differential configuration. During the phase Φ2, the integration capacitors Cint are switched into the feedback paths of the opamp (in response to the switches Φ2 being conductive with the switches Φ1 non-conductive), while the inputs switch to a differential signal $+V_{BE}$. Consequently, in (each) one period of the signals Φ1 and Φ2 a charge equal to $-Cs\cdot 2\cdot V_{BE}$ is transferred from each capacitance Cs to a respective integration capacitor Cint. Since in each interval with bs=1 the capacitance Cs is switched N2 times to inject charge into Cint, the resulting charge transferred during each interval to each integrating capacitor Cint will be equal to $-N2\cdot Cs\cdot 2\cdot V_{BE}$. The differential (delta) voltage in the voltage Vint during that sampling period with bs=1 will be equal to $\Delta V_{int\_bs1}=[(2\cdot N2\cdot Cs\cdot 2)/Cint]\cdot(-V_{BE})$. It is noted that switching N2 times the signals Φ1 and Φ2 again does not represent a disadvantage of the proposed solution with respect to the prior art, in so far as the switched capacitance in the solution of FIGS. 7 and 8 is N2 times smaller, and therefore switching can occur N2 times faster. Thus, each interval with bs=1 in the solution of FIGS. 7 and 8 can have the same clock period of duration Ts as in the solution according to the prior art.

To summarize, in the arrangement to which FIGS. 7 and 8 refer, the selection stage 106 is configured to operate in alternate first (bs=0 cycle) and second (bs=1 cycle) cycles under the control of the pulsed output bitstream bs from the converter 104, 105 to transfer to the sigma-delta analog-to-digital converter 104, 105:

during the first cycles (namely, bs=0 cycle in FIG. 8), a first number N1 of alternations of signal transfer phases Φ1, Φ2 wherein the first signal $\Delta V_{BE}$ indicative of the difference of the voltage drops across the first 111 and second 112 diode-connected transistors is transferred with alternate signs $\Delta V_{BE}$, $-\Delta V_{BE}$ to the converter 104, 105, and during the second cycles (namely, bs=1 cycle in FIG. 8) that alternate with the first cycles (namely, bs=0 cycle in FIG. 8), a second number N2 of alternations of signal transfer phases Φ1, Φ2 wherein the second signal $V_{BE}$ indicative of the voltage drop across the second diode-connected transistor 112 is transferred with alternate signs $V_{BE}$, $-V_{BE}$ to the converter 104, 105.

As already explained in connection with FIGS. 4 and 5, the feedback around the opamp 1040 facilitates having an overall balance of the charge accumulated the during the phase T1 (that is, the time periods during which bs=1) and the charge accumulated during the phase T0 (that is, the time periods during which bs=0).

The same relationships discussed in connection with FIG. 5 apply, namely:

$$G_{LF\_bs0}\cdot\Delta V_{BE}\cdot T_0+G_{LF\_bs1}\cdot(-\Delta V_{BE})\cdot T_1=0$$

Once more, $G_{LF\_bs0}$ and $G_{LF\_bs1}$ can be regarded as indicative of the filtering applied to the input signal $\Delta V_{BE}$ during a period $T_0$ while bs=0 and to the input signal $-V_{BE}$ during a period $T_1$ while bs=1, respectively, so that $$[(2\cdot N1\cdot Cs\cdot 2)/Cint]\cdot(1/Ts)\cdot\Delta V_{BE}\cdot T_0+[(2\cdot N2\cdot Cs\cdot 2)/Cint]\cdot(1/Ts)\cdot(-V_{BE})\cdot T_1=0$$

and thus $$(1-\mu)\cdot N1\cdot Cs\cdot\Delta V_{BE}+\mu\cdot(-N2\cdot Cs\cdot V_{BE})=0$$

so that $$\mu=(N1\cdot Cs/N2\cdot Cs)\cdot\Delta V_{BE}/[V_{BE}+(N1\cdot Cs/N2\cdot Cs)\cdot\Delta V_{BE}],\text{ and}$$

$$\mu=\alpha\cdot\Delta V_{BE}/[V_{BE}+\alpha\cdot\Delta V_{BE}]$$

apply again for the circuit of FIGS. 7 and 8 where (in contrast with FIGS. 5 and 6, where only one period of the signals Φ1 and Φ2 is present during one clock period, Ts=1/fs) the function of the capacitance banks controlled by the "cap_sel" blocks 107 of FIG. 5 is replaced by driving N1 and N2 periods or clock cycles (alternations) of the signals Φ1 and Φ2.

That is, in the arrangement of FIGS. 7 and 8, the gain factor α is a function of the ratio N1/N2 of the first number N1 of alternations to the second number N2 of alternations.

As illustrated in FIGS. 7 and 8, the converter comprises an integrator stage 104 with first and second feedback loops including the switches indicated as Φ1 and Φ2. These switches are configured to be activated alternately based the pulsed output bitstream bs from the converter 104, 105 so that, during the number N1 and the number N2 of alternations of signal transfer phases Φ1, Φ2:

during the first transfer phases, namely Φ1, the integrator stage 104 is set to fixed (optionally unitary) gain in response to first feedback loop (switches Φ1 conductive) activation, with the first signal $\Delta V_{BE}$ and the second signal $V_{BE}$ transferred to the converter 104, 105 with a first sign; and during the second signal transfer phases, namely Φ2, the integrator stage 104 is set to integrator operation (capacitances Cint in the loop) in response to second feedback loop (switches Φ2 conductive) activation, with the first signal $\Delta V_{BE}$ and the second signal $V_{BE}$ transferred to the integrator 104 with a second sign ($-\Delta V_{BE}$ and $-V_{BE}$) opposite the first sign.

As illustrated in FIGS. 7 and 8, the integrator stage in the converter 104, 105 comprises a gain stage 1040; the gain stage input:

i) is configured to be coupled to the gain stage output in response to first feedback loop activation (switches Φ1 conductive) to set the integrator stage 104 to fixed (optionally unitary) gain, and ii) is capacitively coupled (via the capacitances Cs) to the selection stage 106 and configured to be coupled capacitively (capacitances Cint in the loop) to the gain stage 1040 output in response to second feedback loop activation (switches Φ2 conductive) to set the integrator stage 104 to integrator operation.

Advantageously, as illustrated in FIGS. 7 and 8, the gain stage 1040 comprises a fully differential gain stage having first and second input nodes 1041, 1042 capacitively coupled (via the capacitances Cs) to the selection stage 106 as well as first and second output nodes 1043, 1044, plus first feedback loops (including the switches designated Φ1) configured to be activated based the pulsed output bitstream bs from the converter 104, 105 to set the integrator stage to fixed (optionally unitary) gain in response to one of the first and second output nodes 1043 or 1044 being coupled to one of the first and second input nodes 1041, or 1042, and second feedback loops (including the switches designated Φ2) configured to be activated alternately with the first feedback loops (those including the switches designated Φ1) based the pulsed output bitstream bs from the converter 104, 105 to set the integrator stage 104 to integrator operation (Cint in the loop) in response to the other of the first and second output nodes 1044 or 1043) being coupled to the other of the first and second input nodes 1042 or 1041 via an integrator capacitance Cint.

The first and second input nodes 1041, 1042 of the gain stage 1040 are capacitively coupled to the selection stage 106 via respective single ("unitary") capacitances Cs, and the gain factor α is thus a function of the ratio N1/N2 of:

the first number N1 of alternations times the capacitance of these single capacitances Cs, and the second number N2 of alternations times the capacitance of the single capacitances Cs.

As illustrated in FIGS. 7 and 8, the sigma-delta analog-to-digital converter 104, 105 comprises a hysteresis comparator 105 coupled to the gain stage 1040 and configured to produce the pulsed output bitstream bs having a duty cycle μ with a first and a second logic value ("1" and "0", for instance) in response to the output from the gain stage 1040 being higher than an upper threshold of the comparator 105 or lower than a lower threshold of the comparator.

In FIG. 7:

CU denotes a signal generator configured—in a manner known per se to those of skill in the art—to generate signals Φ1 and Φ2 as exemplified in FIG. 8 based on the signal bs; and UD denotes any "user" circuit—of any type known per se to those of skill in the art—configured to exploit the signal bs (essentially the duty-cycle μ thereof) within the framework of a "smart" device as discussed in the introductory portion of this description, for instance.

It is noted that the representation in FIG. 7 is deliberately simplified in so far as the signal bs is optionally converted (in a manner known per se to those of skill in the art) into a signal that more explicitly represents temperature.

This may be via a circuit block like the block indicated by the reference 14 in FIG. 2, configured to convert via coefficients A and B the signal bs into a (Celsius degree, for instance) indication Dout of temperature.

Such a block can be interposed between the output line bs and the circuit UD in FIG. 7 (or be incorporated in the circuit UD) to provide a device comprising a sensor circuit as disclosed herein and a user circuit UD coupled (indirectly, via a block such as the block 14, for instance) to the output 105 and configured to receive therefrom the switching signal bs.

The user circuit UD is thus configured to be operated as a function of the pulsed output bitstream bs from the sensor circuit (from the sigma-delta converter 104, 105, for instance).

A sensor circuit as illustrated in FIG. 7 facilitates obtaining a useful temperature signal based on the charge transfer represented by the equations captioned above.

It will be appreciated that the disclosure provided in connection with FIGS. 7 and 8 focuses primarily on the provision of the signal bs with a duty cycle μ using signals Φ1 and Φ2 that have N1 clock alternations during the bs=0 cycles and N2 clock alternations during the bs=1 cycles with the capacitance banks of FIG. 5 replaced by "unitary" capacitances Cs as illustrated in FIG. 7.

That signal can be used in producing a temperature signal Dout in a "user" device in a manner which is otherwise conventional in the art; this makes it unnecessary to provide herein a more detailed description in addition to the general discussion already provided in connection with FIGS. 2 to 4.

A difference between FIGS. 5 and 6, on one side, and FIGS. 7 and 8, on the other side, lies in the way of obtaining the proportionality factor α. This provides an advantage of the solution describe herein in so far as in the solution of FIGS. 5 and 6 the coefficient α is obtained through the ratio of two capacitances, while in the solution exemplified in FIGS. 7 and 8 the coefficient α is obtained through the ratio of:

the number N1 of switching events (alternations) of the signals Φ1 and Φ2 as during the interval with bs=0, and the number N2 of alternations of the signals Φ1 and Φ2 as during the interval with bs=1.

A capacitance ratio can be implemented with good accuracy in integrated circuit technology.

Obtaining the coefficient α through the ratio of two numbers (numbers of clock pulses) is advantageous in so far as these numbers are hardly affected by inaccuracies, aging effects, or variations currently referred to as PVT variations: these variations are related to the production process (P), the power supply voltage (V) of the device, and with temperature (T).

A solution as proposed herein facilitates obtaining a proportionality factor α with a (much) higher degree of accuracy in comparison with the prior art. This in turn facilitates designing high-accuracy digital temperature sensors.

A high resolution in temperature detection translates into the possibility of being able to use a temperature sensor in high precision applications.

A further advantage related to obtaining a proportionality factor α obtained as ratio of the number of clock cycles, lies in the possibility of devising circuit architecture where the coefficient α can be "trimmed" by modulating the number of clock pulses N1 and N2 generated by a digital phase generator (CU in FIG. 7, for instance). In that way coefficient α can be trimmed digitally.

Without prejudice to the underlying principles, the details and embodiments may vary, even significantly, with respect to what has been described in the foregoing, by way of example only, without departing from the extent of protection.

The extent of protection is determined by the annexed claims.

What is claimed is:

1. A circuit, comprising:

temperature sensing circuitry including first and second diode-connected transistors configured to produce a first signal indicative of a difference of voltage drops across the first and second diode-connected transistors and produce a second signal indicative of the voltage drop across the second diode-connected transistor, wherein the first signal and the second signal increase and decrease, respectively, with temperature, wherein the temperature sensed via the temperature sensing circuitry is a function of the first signal via a gain factor;

a sigma-delta analog-to-digital converter coupled to the temperature sensing circuitry, the sigma-delta analog-to-digital converter having an output node configured to produce a pulsed output bitstream having a duty cycle that is a function of the first signal and the second signal via the gain factor; and a selection stage intermediate the temperature sensing circuitry and the sigma-delta analog-to-digital converter, wherein the selection stage is configured to operate in alternate first and second cycles under control of the pulsed output bitstream from the sigma-delta analog-to-digital converter to transfer to the sigma-delta analog-to-digital converter:

during the first cycles, a first number of alternations of first signal transfer phases, wherein the first signal indicative of the difference of the voltage drops across the first and second diode-connected transistors is transferred with alternating signs to the sigma-delta analog-to-digital converter; and during the second cycles alternating with the first cycles, a second number of alternations of second signal transfer phases, wherein the second signal indicative of the voltage drop across the second diode-connected transistor is transferred with alternating signs to the sigma-delta analog-to-digital converter;

wherein the gain factor is a function of a ratio of the first number of alternations to the second number of alternations.

2. The circuit of claim 1, wherein the sigma-delta analog-to-digital converter comprises an integrator stage with first and second feedback loops configured to be activated alternately based on the pulsed output bitstream from the sigma-delta analog-to-digital converter, wherein, during the first number of alternations of the first signal transfer phases and the second number of alternations of the second signal transfer phases:

during the first signal transfer phases, the integrator stage is set to fixed gain in response to first feedback loop activation, with the first signal and the second signal transferred to the sigma-delta analog-to-digital converter with a first sign; and during the second signal transfer phases, the integrator stage is set to integrator operation in response to second feedback loop activation, with the first signal and the second signal transferred to the sigma-delta analog-to-digital converter with a second sign, opposite the first sign.

3. The circuit of claim 2, wherein the integrator stage is configured to be set to unitary gain during the first signal transfer phases.

4. The circuit of claim 2, wherein the integrator stage in the sigma-delta analog-to-digital converter comprises a gain stage having a gain stage input and a gain stage output, wherein the gain stage input:

is configured to be coupled to the gain stage output in response to the first feedback loop activation to set the integrator stage to the fixed gain; and is capacitively coupled to the selection stage and configured to be coupled capacitively to the gain stage output in response to the second feedback loop activation to set the integrator stage to the integrator operation.

5. The circuit of claim 4, wherein the gain stage comprises a fully differential gain stage comprising:

first and second input nodes capacitively coupled to the selection stage;

first and second output nodes;

the first feedback loops configured to be activated based on the pulsed output bitstream from the sigma-delta analog-to-digital converter to set the integrator stage to the fixed gain in response to one of the first and second output nodes being coupled to one of the first and second input nodes; and the second feedback loops configured to be activated alternately with the first feedback loops based on the pulsed output bitstream from the sigma-delta analog-to-digital converter to set the integrator stage to the integrator operation in response to the other of the first and second output nodes being coupled to the other of the first and second input nodes via an integrator capacitance.

6. The circuit of claim 5, wherein the first and second input nodes of the gain stage are capacitively coupled to the selection stage via respective single capacitances.

7. The circuit of claim 6, wherein the gain factor is a function of the ratio of:

the first number of alternations times a capacitance of the respective single capacitances; and the second number of alternations times the capacitance of the respective single capacitances.

8. The circuit of claim 4, wherein the sigma-delta analog-to-digital converter comprises a hysteresis comparator coupled to the gain stage and configured to produce the pulsed output bitstream having the duty cycle with first and second logic values in response to the output from the gain stage being higher than an upper threshold of the comparator or lower than a lower threshold of the comparator.

9. The circuit of claim 1, wherein the first and second diode-connected transistors:

are bipolar transistors; and/or have bias currents with a first predetermined ratio to each other; and/or have junction areas with a second predetermined ratio to each other.

10. The circuit of claim 1, wherein the duty cycle of the pulsed output bitstream is μ and equals:

$$\mu = \alpha \cdot \Delta V_{BE} / [V_{BE} + \alpha \cdot \Delta V_{BE}],$$

where:

$\Delta V_{BE}$ is the first signal indicative of the difference of the voltage drops across the first and second diode-connected transistors;

$V_{BE}$ is the second signal indicative of the voltage drop across the second diode-connected transistor; and α is the gain factor.

11. A device comprising:

a first circuit comprising:

temperature sensing circuitry including first and second diode-connected transistors configured to produce a first signal indicative of a difference of voltage drops across the first and second diode-connected transistors and produce a second signal indicative of the voltage drop across the second diode-connected transistor, wherein the first signal and the second signal increase and decrease, respectively, with temperature, wherein the temperature sensed via the temperature sensing circuitry is a function of the first signal via a gain factor;

a sigma-delta analog-to-digital converter coupled to the temperature sensing circuitry, the sigma-delta analog-to-digital converter having an output node configured to produce a pulsed output bitstream having a duty cycle that is a function of the first signal and the second signal via the gain factor; and a selection stage intermediate the temperature sensing circuitry and the sigma-delta analog-to-digital converter, wherein the selection stage is configured to operate in alternate first and second cycles under control of the pulsed output bitstream from the sigma-delta analog-to-digital converter to transfer to the sigma-delta analog-to-digital converter:

during the first cycles, a first number of alternations of first signal transfer phases, wherein the first signal indicative of the difference of the voltage drops across the first and second diode-connected transistors is transferred with alternating signs to the sigma-delta analog-to-digital converter; and during the second cycles alternating with the first cycles, a second number of alternations of second signal transfer phases, wherein the second signal indicative of the voltage drop across the second diode-connected transistor is transferred with alternating signs to the sigma-delta analog-to-digital converter;

wherein the gain factor is a function of a ratio of the first number of alternations to the second number of alternations; and a user circuit coupled to the first circuit and configured to be operated as a function of the pulsed output bitstream.

12. A method, comprising:

producing, by first and second diode-connected transistors, a first signal indicative of a difference of voltage drops across the first and second diode-connected transistors, and producing a second signal indicative of the voltage drop across the second diode-connected transistor, the first signal and the second signal increasing and decreasing, respectively, with absolute temperature sensed being a function of the first signal via a gain factor;

processing, by a sigma-delta analog-to-digital converter, the first signal and the second signal to produce a pulsed output bitstream having a duty cycle that is a function of the first signal and the second signal via the gain factor; and operating a selection stage, intermediate the first and second diode-connected transistors and the sigma-delta analog-to-digital converter, in alternate first and second cycles under control of the pulsed output bitstream to transfer to the sigma-delta analog-to-digital converter such that:

during the first cycles, a first number of alternations of first signal transfer phases, the first signal indicative of the difference of the voltage drops across the first and second diode-connected transistors being transferred with alternating signs to the sigma-delta analog-to-digital converter; and during the second cycles alternating with the first cycles, a second number of alternations of second signal transfer phases, the second signal indicative of the voltage drop across the second diode-connected transistor being transferred with alternating signs to the sigma-delta analog-to-digital converter;

the gain factor being a function of a ratio of the first number of alternations to the second number of alternations.

13. The method of claim 12, wherein the sigma-delta analog-to-digital converter comprises an integrator stage with first and second feedback loops configured to be activated alternately based on the pulsed output bitstream from the sigma-delta analog-to-digital converter, and the method further comprises, during the first number of alternations of the first signal transfer phases and the second number of alternations of the second signal transfer phases:

during the first signal transfer phases, setting the integrator stage to fixed gain in response to first feedback loop activation, with the first signal and the second signal transferred to the sigma-delta analog-to-digital converter with a first sign; and during the second signal transfer phases, setting the integrator stage to integrator operation in response to second feedback loop activation, with the first signal and the second signal transferred to the sigma-delta analog-to-digital converter with a second sign, opposite the first sign.

14. The method of claim 13, further comprising setting the integrator stage to unitary gain during the first signal transfer phases.

15. The method of claim 13, wherein the integrator stage in the sigma-delta analog-to-digital converter comprises a gain stage having a gain stage input and a gain stage output, the gain stage input being capacitively coupled to the selection stage, and the method further comprises:

coupling the gain stage input to the gain stage output in response to the first feedback loop activation to set the integrator stage to the fixed gain; and capacitively coupling the gain stage input to the gain stage output in response to the second feedback loop activation to set the integrator stage to the integrator operation.

16. The method of claim 15, wherein the gain stage comprises a fully differential gain stage comprising first and second input nodes capacitively coupled to the selection stage, first and second output nodes, the first feedback loops, and the second feedback loops, and the method further comprises:

activating the first feedback loops based on the pulsed output bitstream from the sigma-delta analog-to-digital converter to set the integrator stage to the fixed gain in response to one of the first and second output nodes being coupled to one of the first and second input nodes; and activating second feedback loops, alternately with the first feedback loops, based on the pulsed output bitstream from the sigma-delta analog-to-digital converter to set the integrator stage to the integrator operation in response to the other of the first and second output nodes being coupled to the other of the first and second input nodes via an integrator capacitance.

17. The method of claim 16, further comprising capacitively coupling the first and second input nodes of the gain stage to the selection stage via respective single capacitances.

18. The method of claim 17, wherein the gain factor is a function of the ratio of:

the first number of alternations times a capacitance of the respective single capacitances; and the second number of alternations times the capacitance of the respective single capacitances.

19. The method of claim 15, wherein the sigma-delta analog-to-digital converter comprises a hysteresis comparator coupled to the gain stage, and the method further comprises:

producing the pulsed output bitstream having the duty cycle with first and second logic values in response to the output from the gain stage being higher than an upper threshold of the comparator or lower than a lower threshold of the comparator.

20. The method of claim 12, wherein the duty cycle of the pulsed output bitstream is μ and equals:

$$\mu = \alpha \cdot \Delta V_{BE} / [V_{BE} + \alpha \cdot \Delta V_{BE}],$$

where:

$\Delta V_{BE}$ is the first signal indicative of the difference of the voltage drops across the first and second diode-connected transistors;

$V_{BE}$ is the second signal indicative of the voltage drop across the second diode-connected transistor; and α is the gain factor.

* * * * *